April 20, 1965 N. F. BOUNSALL 3,179,817
DIODE BRIDGE GATING CIRCUIT WITH OPPOSITE CONDUCTIVITY TYPE TRANSISTOR FOR CONTROL
Filed Oct. 22, 1962
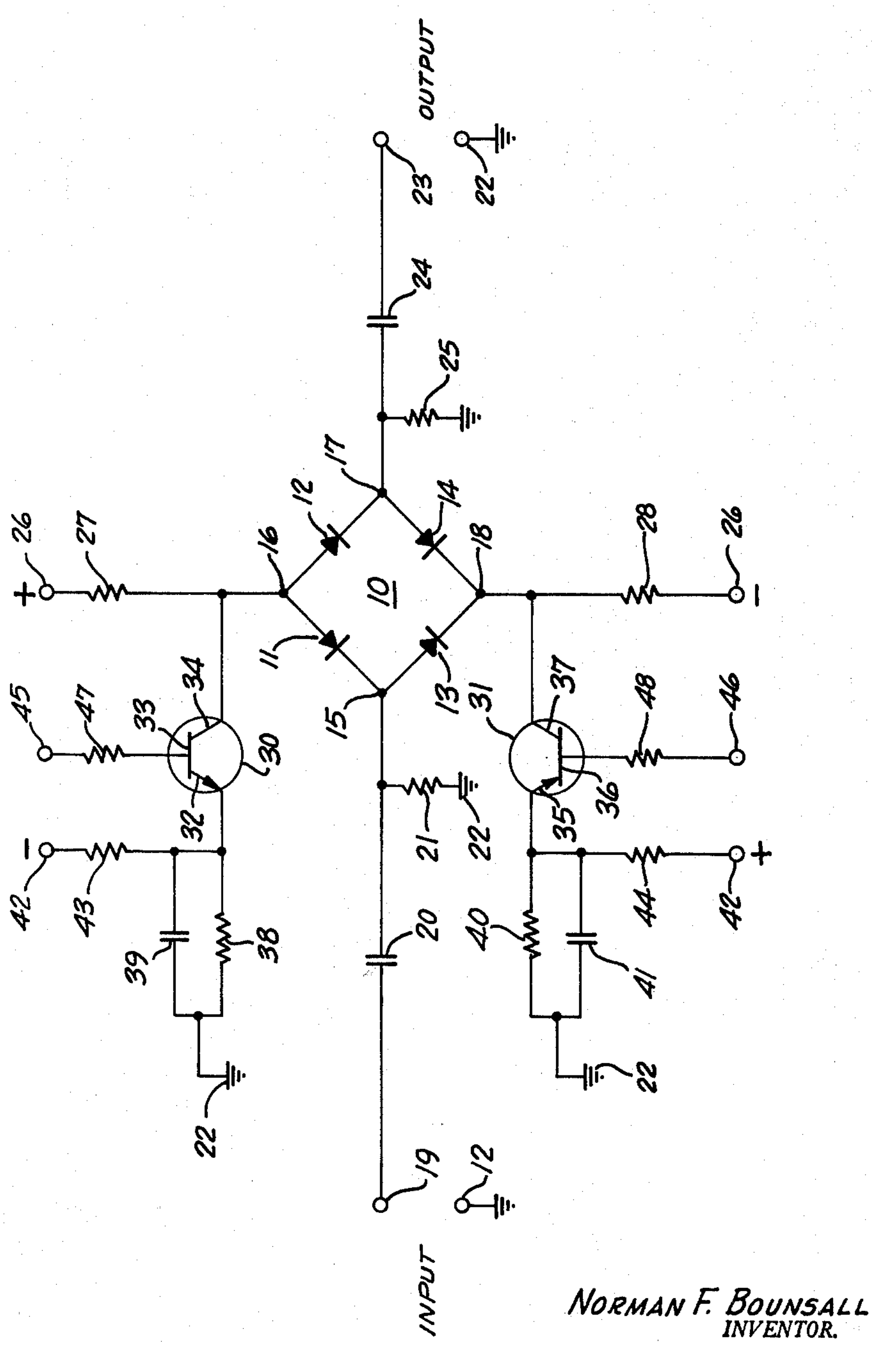
NORMAN F. BOUNSALL
INVENTOR.
BY Robert G. Clay
ATTORNEY United States Patent Office 3,179,817
Patented Apr. 20, 1965

3,179,817

DIODE BRIDGE GATING CIRCUIT WITH OPPOSITE CONDUCTIVITY TYPE TRANSISTORS FOR CONTROL

Norman Frederick Bounsall, Palo Alto, Calif., assignor to Ampex Corporation, Redwood City, Calif., a corporation of California
Filed Oct. 22, 1962, Ser. No. 232,017
3 Claims. (Cl. 307—88.5)

This invention relates to electronic gating circuits and more particularly to diode gating circuits having minimum leakage.

In prior six-diode-bridge gating circuits, two control diodes have been used to control the "ON-OFF" condition of four gating diodes arranged in a bridge configuration. The two control diodes clamp a control source to two junction terminals of the bridge circuit. However, six-diode-bridge gating circuits employing control diodes, particularly when used at high frequencies, have certain disadvantages and drawbacks, such as relatively high impedance paths between the two junction terminals and the control source during the "OFF" condition of the diode gate. At this time, the control diodes are conducting and the resultant current reverse biases the gating diodes. Each high impedance path between one of the two junction terminals of the bridge circuit and the control source is comprised of a series combination of the relatively high impedance of one conducting control diode and the relatively high output impedance of the control source. A.C. signal currents leaking through the first two gating diodes of the bridge circuit flow through the high impedance paths to produce relatively high voltages at the two junction terminals of the bridge circuit. Large portions of the high voltages at the two junction terminals leak through the last two gating diodes and appear in the output circuit of the diode bridge. Thus, this type of diode-bridge gating circuit has a relatively high level of leakage that limits its use.

It is, therefore, the principal aim of this invention to provide a simple and inexpensive way to overcome the disadvantages and limitations of prior diode-bridge gating circuits. This is accomplished by providing low impedance paths between the two control junction terminals of the diode-bridge circuit and ground during the "OFF" condition of the diode gate. Control transistors are used in place of control diodes for clamping capacitors to the two junction terminals of the diode-bridge circuit. Each low impedance path between one of the two junction terminals and ground is comprised of the relatively low emitter-to-collector impedance of one conducting control transistor and the low impedance of one capacitor. A.C. signal currents leaking through the first two gating diodes of the bridge circuit are effectively shorted to ground through the low impedance paths. Thus, relatively low voltages appear at the two junction terminals of the bridge circuit. Small portions of the low voltages at the two terminals leak through the last two gating diodes, thereby causing the diode gate to have a low level of leakage. Accordingly, this unique and novel arrangement of the present invention provides a diode-bridge gating circuit having minimum leakage.

It is, therefore, the principal object of this invention to provide a simple and inexpensive way of improving prior diode-bridge gating circuits.

Another object of this invention is to provide a diode-bridge gating circuit that has minimum leakage.

Other objects and advantages of this invention will be apparent from the following detailed description of a preferred embodiment of the invention when taken with the drawing which shows in the sole figure a schematic diagram of the preferred embodiment of the invention.

Referring now to the sole figure, there is shown a diode gating circuit 10 comprising four gating diodes 11, 12, 13 and 14 arranged in a bridge configuration. An input signal is applied to an input terminal 19 which is coupled to an input junction terminal 15 between the cathode of diode 11 and the anode of diode 13 through capacitor 20. The junction terminal 15 of the diode gate 10 is coupled to a ground terminal 22 through input resistor 21. An output signal may be derived from an output terminal 23 which is coupled to an output junction terminal 17 between the cathode of diode 12 and the anode of diode 14 through capacitor 24. The junction terminal 17 of the diode gate 10 is coupled to the ground terminal 22 through output resistor 25. The positive terminal of power supply 26 is coupled to a control junction terminal 16 between the anodes of diodes 11 and 12 through resistor 27, and the negative terminal of power supply 26 is coupled to a control junction terminal 18 between the cathodes of diodes 13 and 14 through resistor 28. The power supply 26 provides the correct bias voltages and bias current to the diode gate 10. Thus, in the absence of any other biasing voltages or currents, the gating diodes 11, 12, 13 and 14 are normally conducting.

In accordance with the present invention, there are provided low impedance paths between the two junction terminals 16 and 18 of the diode gate 10 and ground terminal 22 during the "OFF" condition of the diode gate 10. This is accomplished by connecting opposite conductivity-type control transistors 30 and 31 to the junction terminals 16 and 18, respectively. NPN transistor 30 consists of an emitter electrode 32, a base electrode 33 and a collector electrode 34 while PNP transistor 31 consists of an emitter electrode 35, a base electrode 36 and a collector electrode 37. The collector electrode 34 of control transistor 30 is coupled to the junction terminal 16 between the anodes of diodes 11 and 12, and collector electrode 37 of control transistor 31 is coupled to the junction terminal 18 between the cathodes of diodes 13 and 14. The control transistors 30 and 31 selectively clamp parallel combinations of resistor 38 and capacitor 39 and resistor 40 and capacitor 41 to the junction terminals 16 and 18 of diode-bridge circuit 10. The parallel combination of resistor 38 and capacitor 39 is coupled between the emitter electrode 32 of transistor 30 and ground terminal 22 while the parallel combination of resistor 40 and capacitor 41 is coupled between the emitter electrode 35 of transistor 31 and ground terminal 22. Each low impedance path between the one of two junction terminals 16 and 18 and ground terminal 22 is comprised of the relatively low emitter-to-collector impedance of one conducting control transistor 30, 31 and the low impedance of one parallel combination of resistor 38, 40 and capacitor 39, 41. A.C. signal currents leaking through the first two gating diodes 11 and 13 of the bridge circuit are effectively shorted to ground terminal 22 through the low impedance paths. Thus, relatively low voltages appear at the two junction terminals 16 and 18 of the diode gate 10.

Power supply 42 provides the proper bias voltages for the control transistors 30 and 31 by virtue of its negative terminal being coupled to the emitter electrode 32 of NPN transistor 30 through resistor 43 and its positive terminal being coupled to the emitter electrode 35 of PNP transistor 31 through resistor 44. Voltages appearing at terminals 45 and 46 are coupled to the base electrodes 33 and 36 through resistors 47 and 48 for controlling the conductivities of transistors 30 and 31, thereby controlling the gating action of the diode gate 10.

In operation, the "ON-OFF" condition of the diode gate 10 is regulated by the transistors 30 and 31 so that when a negative control signal is applied to terminal 45, the NPN transistor 30 is turned off. At the same time, a positive control signal is applied to terminal 46 to turn off PNP transistor 31. The power supply 26 provides the correct bias voltages and bias currents to the diodes 11, 12, 13 and 14 of the gate 10, thereby causing the gating circuit to open and pass signal information applied to input terminal 19.

On the other hand when the control signals applied to terminals 45 and 46 are reversed in polarity, the control transistors 30 and 31 are turned on. The resultant current that passes through the transistors 30 and 31 reverse biases the gating diodes 11, 12, 13 and 14, thereby causing the gating circuit to close. However, during the "OFF" condition, signal information appearing at input terminal 19 causes A.C. signal currents to leak through the first two gating diodes 11 and 13. The A.C. leakage currents are effectively shorted to ground 22 through the low impedance paths comprised of the low emitter-to-collector impedances of the control transistors 30 and 31 and the low impedances of the parallel combinations of resistor 38 and capacitor 39 and resistor 40 and capacitor 41. By way of example, attenuation factors of 2000:1 may be obtained for frequencies up to 20 megacycles by choosing the correct values for resistors 38 and 40 and capacitors 39 and 41. Thus, relatively low voltages appear at the two junction terminals 16 and 18 of the diode gate 10. Small portions of the low voltages at the two terminals 16 and 18 leak through the last two gating diodes 12 and 14, thereby causing the diode gate 10 to have a low level of leakage.

Thus, it is seen that the present invention provides a diode-bridge gating circuit having minimum leakage.

Although the present invention has been shown and described in terms of a preferred embodiment, changes and modifications which do not depart from the inventive concepts taught herein will suggest themselves to those skilled in the art. Such changes and modifications are deemed to fall within the scope of the invention.

What is claimed is:

1. An electronic gating circuit comprising:
a diode-bridge gating circuit having an input junction, control junctions, and an output junction; and
opposite conductivity type transistors for controlling the "ON-OFF" condition of said diode-bridge gating circuit,
said control transistors coupled between the control junctions of said diode-bridge gating circuit and ground and being conductive to provide low impedance paths for effectively shorting leakage currents during the "OFF" condition of said diode-bridge gating circuit, and means for coupling control voltage to said transistors in isolated relation to said low impedance paths to selectively render said transistors conductive.

2. An electronic gating circuit comprising:
a diode-bridge gating circuit having an input junction, control junctions, and an output junction;
a pair of opposite conductivity type transistors for controlling the "ON-OFF" condition of said diode-bridge gating circuit;
a pair of capacitors,
said control transistors and said capacitors coupled between the control junctions of said diode-bridge gating circuit and ground, said transistors having a conductive state during the "OFF" condition of said diode-bridge gating circuit to provide low impedance paths for effectively shorting leakage currents therein, and means for coupling control voltage to said transistors in isolated relation to said low impedance paths to selectively effect said conductive state of said transistors.

3. An electronic gating circuit comprising a diode-bridge gating circuit having an input lead, control junctions, and an output lead, a pair of opposite conductivity type transistors for controlling the "ON-OFF" condition of said diode-bridge gating circuit, said transistors each having base, emitter, and collector electrodes, means coupling the emitter and collector electrodes of respective ones of said transistors in series circuit paths between ground and said control junctions, bias means coupled to said transistors and said gating circuit to normally maintain the diodes of said gating circuit and said transistors respectively in states of opposite conductivity and thereby normally establish one of said "ON-OFF" conditions of said gating circuit, and means for applying control signals to said base electrodes of said transistors of a polarity to reverse the normal state of conductivity thereof with an accompanying reversal of the normal state of conductivity of said diodes, said diodes being thereby conductive and said transistors being non-conductive in the "ON" condition of said gating circuit, said diodes being thereby non-conductive and said transistors being conductive in the "OFF" condition of said gating circuit, said transistors providing low impedance circuit paths to ground through the collector-emitter circuits thereof during conduction of said transistors.

References Cited by the Examiner

UNITED STATES PATENTS

| | | | |
|---|---|---|---|
| 2,782,307 | 2/57 | Von Sivers et al. | 307—88.5 |

FOREIGN PATENTS

| | | |
|---|---|---|
| 220,065 | 1/58 | Australia. |
| 1,063,208 | 8/59 | Germany. |

ARTHUR GAUSS, *Primary Examiner.*